United States Patent
Filler et al.

(10) Patent No.: US 8,718,967 B2
(45) Date of Patent: May 6, 2014

(54) FLEXIBLE STORAGE INTERFACE TESTER WITH VARIABLE PARALLELISM AND FIRMWARE UPGRADEABILITY

(75) Inventors: Scott Filler, Santa Clara, CA (US); Hendrik Jan (Erik) Volkerink, Palo Alto, CA (US); Ahmed Sami Tantawy, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 13/499,637

(22) PCT Filed: May 18, 2011

(86) PCT No.: PCT/US2011/036899
§ 371 (c)(1),
(2), (4) Date: Mar. 30, 2012

(87) PCT Pub. No.: WO2011/149725
PCT Pub. Date: Dec. 1, 2011

(65) Prior Publication Data
US 2012/0191402 A1  Jul. 26, 2012

Related U.S. Application Data

(60) Provisional application No. 61/349,411, filed on May 28, 2010.

(51) Int. Cl.
| | |
|---|---|
| *G01R 31/319* | (2006.01) |
| *G01R 31/28* | (2006.01) |
| *G06F 11/263* | (2006.01) |
| *G06F 11/273* | (2006.01) |
| *G06F 17/00* | (2006.01) |
| *G11C 29/56* | (2006.01) |

(52) U.S. Cl.
CPC ...... *G01R 31/31908* (2013.01); *G01R 31/2834* (2013.01); *G06F 11/263* (2013.01); *G06F 11/2733* (2013.01); *G06F 17/00* (2013.01); *G11C 29/56* (2013.01)
USPC ............ 702/119; 702/117; 702/118; 702/120

(58) Field of Classification Search
CPC ..................... G01R 31/2834; G01R 31/31908; G06F 11/263; G06F 11/2733; G06F 17/00; G11C 29/56
USPC ............. 702/81, 83, 117, 118, 119, 120, 182, 702/183, 186
See application file for complete search history.

(56) References Cited

U.S. PATENT DOCUMENTS

| | | | | |
|---|---|---|---|---|
| 6,360,180 | B1* | 3/2002 | Breger | 702/108 |
| 2002/0105348 | A1* | 8/2002 | Resor, III | 324/758 |

(Continued)

OTHER PUBLICATIONS

International Search Report and Written Opinion issued in PCT/US2011/036899 on Dec. 4, 2012.

(Continued)

*Primary Examiner* — Sujoy Kundu
*Assistant Examiner* — Paul D Lee
(74) *Attorney, Agent, or Firm* — Manuel de la Cerra

(57) ABSTRACT

A system for use in automated test equipment. In one embodiment, the system includes a configurable integrated circuit (IC) programmable to provide test patterns for use in automated test equipment. The configurable IC includes a configurable interface core that is programmable to provide functionality of one or more protocol based interfaces for a device under test (DUT) and is programmable to interface with the DUT. The system also includes a connection configurable to couple the configurable IC to the DUT.

9 Claims, 13 Drawing Sheets

(56) References Cited

U.S. PATENT DOCUMENTS

| | | |
|---|---|---|
| 2006/0242504 A1 | 10/2006 | Kadota |
| 2007/0198881 A1 | 8/2007 | Volkerink et al. |
| 2007/0266288 A1* | 11/2007 | Volkerink et al. ............. 714/738 |
| 2008/0290885 A1* | 11/2008 | Matsunami ................... 324/758 |
| 2009/0113245 A1 | 4/2009 | Conner |
| 2009/0184725 A1* | 7/2009 | Tunaboylu ................... 324/754 |
| 2009/0248347 A1 | 10/2009 | Akhtar et al. |
| 2010/0079159 A1 | 4/2010 | Kemmerling |
| 2011/0276302 A1* | 11/2011 | Rivoir .......................... 702/117 |

OTHER PUBLICATIONS

International Search Report issued Dec. 7, 2011 in PCT/US2011/036899.

\* cited by examiner

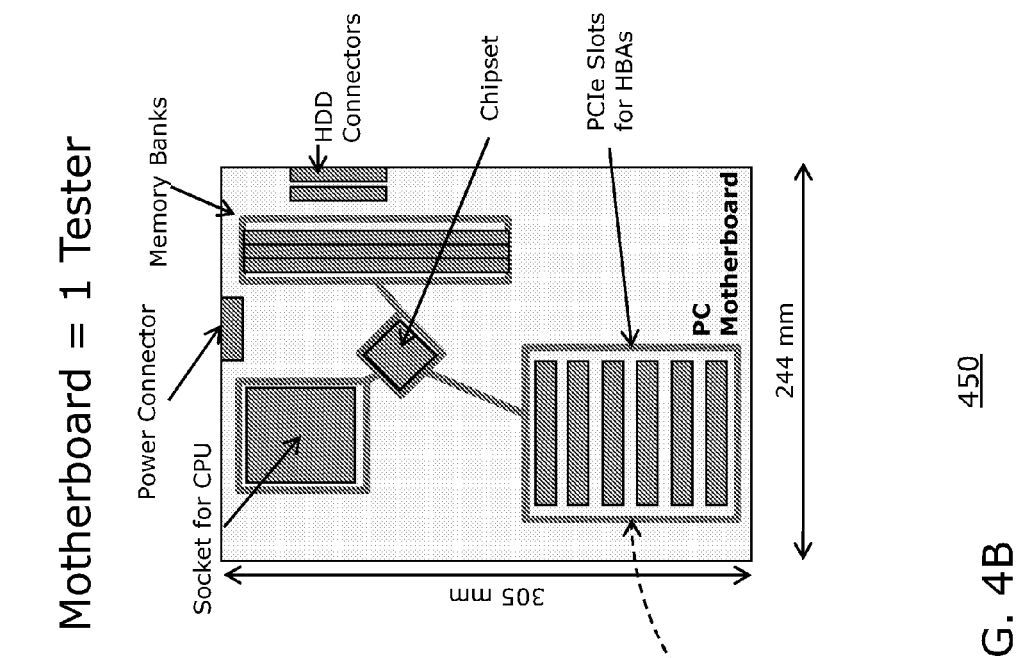
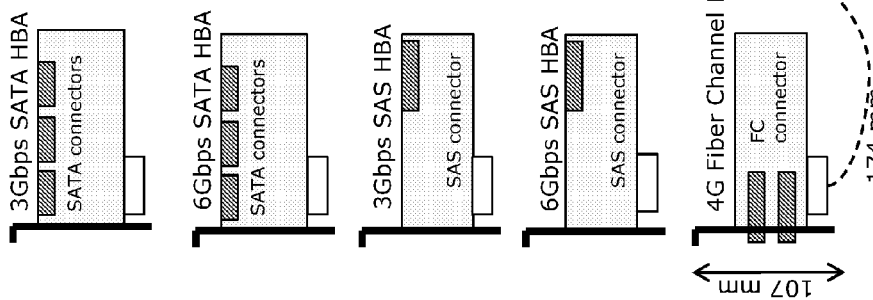
FIG. 4B
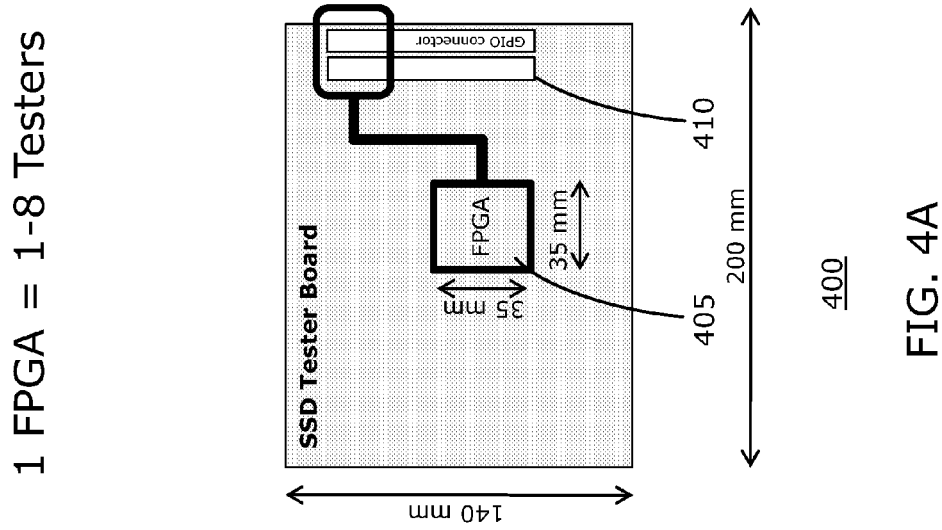
FIG. 4A

| Product Category | Form factor | Protocol | Performance in MB/s | Number of device pins / lanes | DUTs in parallel for 32 pin FPGA |
|---|---|---|---|---|---|
| Disk 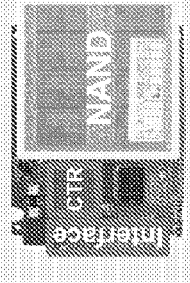 | 1.8"<br>2.5"<br>3.5" | PATA<br>SATA<br>USB<br>SAS<br>FC | up to 133<br>100 – 500<br>120 – 600<br>275 – 1600<br>200 – 3200 | 40 / parallel<br>4 per lane / 1 lane<br>2 per lane / 1 lane<br>4 per lane / 1-4 lanes<br>4 per lane / 1 lane | n/a<br>8<br>16<br>8-2<br>8 |
| PC Card 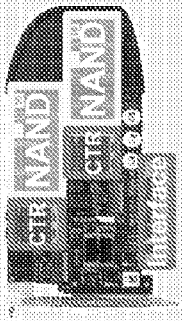 | PC add-in card<br>x1-x4<br>x8-x16 | PCIe<br>1.0<br>2.0<br>3.0 | x1-x16 lanes<br>250/lane<br>500/lane<br>1000/lane | 4 pins per lane /<br>1,4,8,16 | 8, 2, 1, n/a |

FIG. 8A

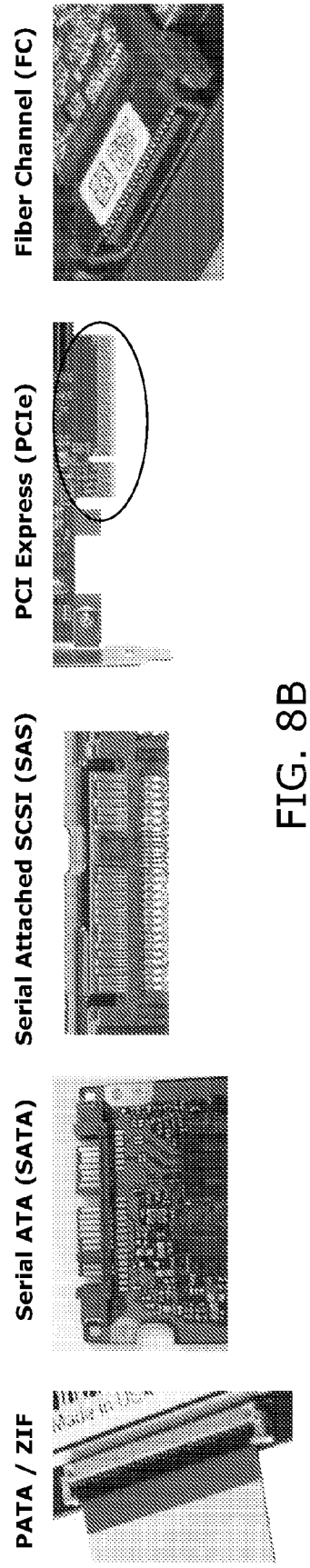

FLEXIBLE STORAGE INTERFACE TESTER WITH VARIABLE PARALLELISM AND FIRMWARE UPGRADEABILITY

CROSS REFERENCE TO RELATED APPLICATION

The present invention is filed under 35 U.S.C. §371 as the U.S. national phase of International Application No. PCT/US2011/036899, filed May 18, 2011, which designated the U.S. and claims the benefit of priority to U.S. Provisional Patent Application No. 61/349,411, filed May 28, 2010, and claims priority thereto. The specification of application No. 61/349,411 is hereby incorporated by reference in its entirety.

FIELD OF THE INVENTION

Embodiments relate to testing, and in particular to the testing of solid state storage devices.

BACKGROUND

Solid state drives (SSDs) are data storage devices that use solid-state memory to store persistent data. An SSD emulates a hard disk drive interface, thus easily replacing it in most applications. An SSD connects to a personal computer (PC) via a standardized electrical communication protocol and a physical interface connector. Common examples of SSDs are battery backed dynamic random access memory (DRAM) volatile memory, NAND/NOR-based flash memory, and other non-volatile storage class technologies. SSDs can have different form factors. SSDs are a relatively new product, and the industry is in the process of defining how to test them. Testing a variety of form factors and interface standards presents both mechanical and protocol/electrical challenges. In order to test an SSD, the tester needs to be able to connect via the physical connector, and support the interface protocol and electrical signaling.

Currently, the predominant testing architecture uses PC-based testers. A PC may connect to a storage device through a host bus adapter (HBA) and a cable. The HBA and its software drivers provide the physical connector, the communication protocol, and electrical engine to convert operating system and storage protocol level commands from the computer into commands that the storage device can understand. The HBA may plug into the motherboard. The PC motherboard may include a central processing unit (CPU), memory, and the buses and controller chips to run the CPU, memory, and host bus adapters. An operating system and drivers are required to run programs on the PC. The CPU and memory act as a shared pattern generator resource by running a program to send and receive data from the storage device. A problem with PC-based testers is that they have performance and parallelism limitations that are based on the performance of the components used. In addition, ways to enhance performance and increase parallelism can be costly.

SUMMARY OF THE INVENTION

In one embodiment, a system for use in automated test equipment is provided. In one embodiment, the system includes a configurable integrated circuit (IC) programmable to provide test patterns for use in automated test equipment. The configurable IC includes a configurable interface core that is programmable to provide functionality of one or more protocol based interfaces for a device under test (DUT) and is programmable to interface with the DUT. The system also includes a connection configurable to couple the configurable IC to the DUT.

BRIEF DESCRIPTION OF THE DRAWINGS

FIGS. 4A and 4B illustrate size differences between an FPGA-based tester system and a PC-based tester system.

FIGS. 8A and 8B illustrate various devices under test (DUTs) that an FPGA-based tester system may test.

DETAILED DESCRIPTION

Embodiments described herein provide a system for use in automated test equipment. Embodiments also provide a corresponding method for testing a device under test (DUT), where the method may be employed using the system embodiments disclosed herein. In one embodiment, a system includes a configurable integrated circuit (IC), such as a field programmable gate array (FPGA), programmed to provide test patterns for use in automated test equipment. The configurable IC includes an interface core that interfaces with at least one DUT and that provides the functionality of a host bus adapter. The phrases interface core and IP core are used interchangeably. The system also includes a connection to the at least one DUT, wherein the connection is coupled directly between the configurable IC and the at least one DUT. As described in more detail below, the configurable IC implements the functionality of PC-based testers, yet avoids the inherent deficiencies of PC-based testers with respect to flexibility, scalability, performance, and cost.

As described in more detail below, the configurable IC provides much flexibility in testing DUTs. As described in more detail below, some of the benefits include smaller tester sizes, increased interface flexibility, greatly simplified product mix support, lower cost, and improved correlation and compatibility.

Figure 1:
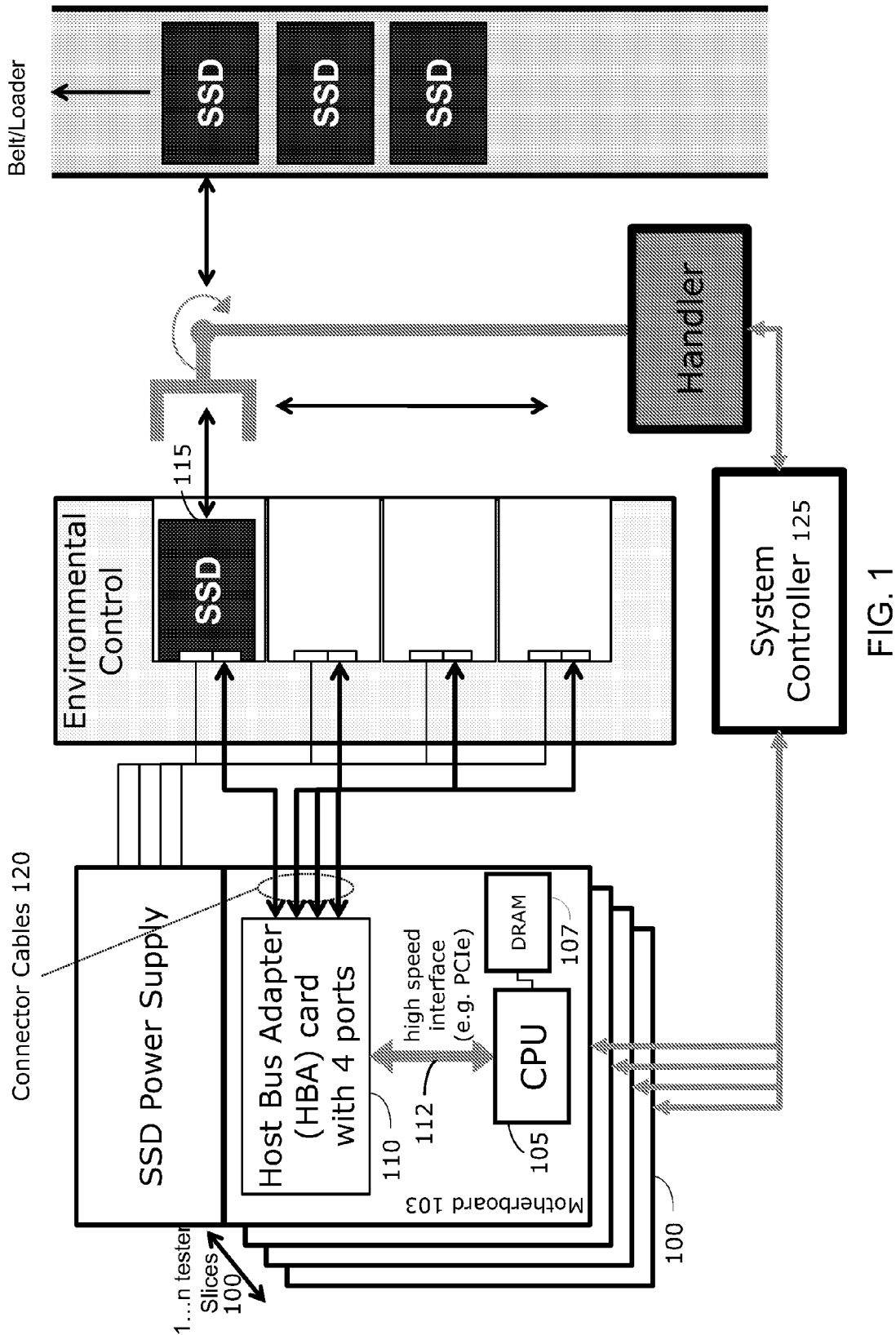
FIG. 1 illustrates a block diagram of an example PC-based tester system.

FIG. 1 illustrates a block diagram of an example PC-based test system. In general, PC-based testers are board/component based testers. A PC-based tester 100 includes a motherboard 103, a CPU 105, DRAM memory 107, an HBA card 110, all of which are required to create a PC-based tester. A typical size for such a tester in a mini tower case is 420×175× 360 mm.

In one embodiment, CPU 105 is connected by a high-speed interface (e.g., PCIe) 112 to the HBA card 110, which may generally include 1 to 4 ports. The HBA card 110 is connected to one or more SSDs 115 by a connector cable 120 that plugs into the available HBA ports. Computer-based system controller 125 is connected to one or more PC-based testers 100, and is used to control the individual PC testers. There may be a plurality of PC-based testers 100, also referred to as tester slices 100, each comprising a motherboard, CPU, memory, and associated HBA card. Note that the terms CPU and processor are used interchangeably.

For production test and benchmarking of SSDs cost is directly influenced by the number of devices you can test in parallel. Each PC based tester is optimized for a fixed parallelism and interface standard. It is not possible to support multiple standards or higher levels of parallelism without replacement of the HBA cards. Replacement of HBA cards adds to the cost of the tester. With the current 64-128 DUT parallelism of PC based testers 8-16 HBA cards need to be replaced, which is time consuming but doable. With higher parallelisms (e.g. 1024 DUTs=128 HBA cards) reconfiguring a tester can be impracticable and introduce many errors if this process is done manually.

With PC-based testers, the flexibility to test multiple interfaces is limited by the availability and cost of adding HBA cards. Also, HBA cards need to be physically swapped out, requiring significant downtime as parallelism increases.

Because PC-based testers leverage existing boards for PC applications like host bus adapters, there is limited flexibility when new or existing interface standards are needed to connect to DUTs. Typically, one HBA is required per interface standard needing support. The parallelism is fixed between 4-8 DUTs per HBA card and can not be modified. Furthermore, the HBA card needs to be physically removed from the motherboard and replaced with a different HBA card to support a different interface. For example, if a PC-based tester is configured to connect to SATA devices it needs a SATA HBA. A particular HBA may be on the motherboard or on a separate HBA card. If the PC tester then needs to support a fibre channel DUT, a new fibre channel HBA needs to be purchased. The SATA HBA is physically removed and the Fibre Channel HBA is then physically inserted in place of the SATA HBA. The PC is not meant to be a flexible storage tester, as a PC typically functions as a general purpose computer for desktop or data center applications. A smaller size/footprint results in custom boards with higher cost.

The main reasons for using a PC for testing storage devices are: 1) it is a well-known general purpose computer architecture; 2) it is typically cheaper (e.g., less development cost and leverage with high volume PC components); and 3) the tested storage devices end up being used in PCs. As such, there is the added benefit of being able to create a tester environment that is very close to the end use scenario.

As the volume of shipped SSD product increases, there is a need to test these storage products more efficiently. This will require equipment that can handle multiple interfaces and form factors in a single tester so as to: a) improve the flexibility and efficiency of testing a mix of products; b) provide higher density/higher parallelism test stations per square foot; and c) increased tester speeds/performance to enable optimal test times and avoid the test time overhead disadvantages of shared-resource architectures.

As described in more detail below in connection with FIGS. 2-8, embodiments described herein employ a configurable/programmable IC (e.g., an FPGA) that implements custom firmware and software images that implement the functionality of one or more PC-based testers in a single chip.

Embodiments described herein use programmable ICs, which in turn allow a large degree of flexibility to optimize for performance, parallelism, and cost, and enable a software-based upgrade path to yet-to-be-released protocol interfaces for storage testing applications like SSDs, HDDs, etc.

Unlike PC-based testers, which require different HBA cards or potentially different testers to test different storage device form factors, physical connectors, and interface standards, a single programmable IC-based tester such as an FPGA-based tester may test a wide array of different storage device form factors, physical connectors, and interface standards. FPGA-based testers achieve this flexibility by a user simply loading a new, appropriate configuration into a programmable chip/FPGA.

Embodiments described herein utilize the programmability of FPGAs to: (a) replace physical HBAs for storage testing automatic test equipment (ATE); (b) optimize the number of copies of a given interface to get maximum parallelism and thus reduce cost; (c) have the ability to support future interface standards or upgrade existing ones without buying a new tester; and (d) enable new business models like pay-per-use where a user pays a low base cost for the test system and you pay extra only when a user uses/needs a new interface.

Figure 2:
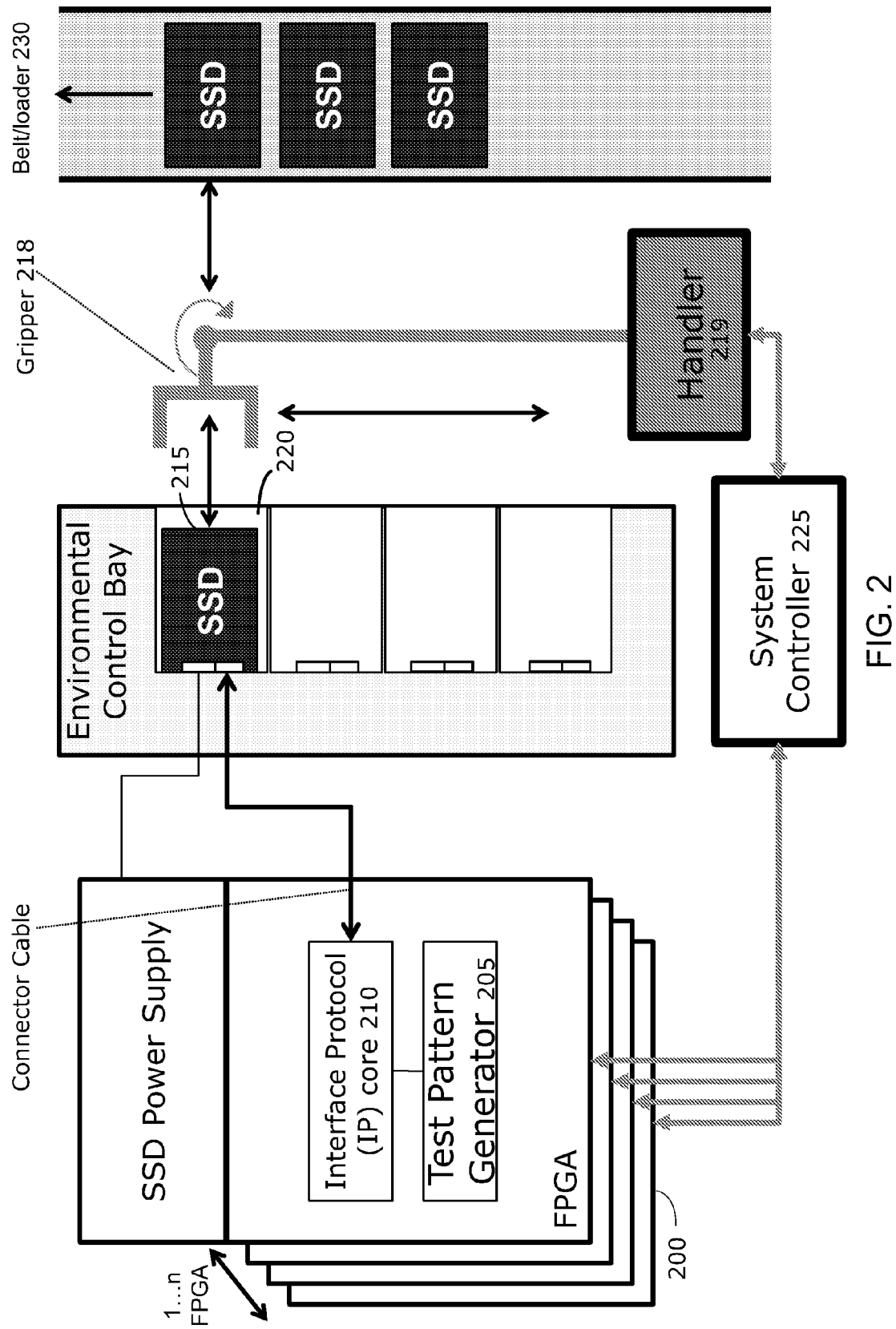
FIG. 2 illustrates a block diagram of an example field programmable gate array (FPGA)-based tester system, according to one embodiment.

FIG. 2 illustrates a block diagram of an example FPGA-based tester system according to one embodiment. One or more FPGAs 200 each include a test pattern generator (TPG) 205 in close proximity to an interface protocol (IP) core 210. IP core 210 is coupled directly to a DUT 215, which may be a storage device, such as an SSD. In some embodiments, other types of storage devices may include a hard disk drive (HDD), USB drive, flash cards, and a DRAM based disk. The connection between the TPG and IP core may be a bus (parallel or serial) with one or more links to provide sufficient bandwidth.

In one embodiment, each FPGA implements custom firmware and software images to implement the functionality of one or more PC based testers in a single chip. The required electrical signaling and protocol-based signaling is provided by on-chip IP cores in the FPGAs. In one embodiment, the interface core provides the functionality of the HBA. In one embodiment, each FPGA is programmable with pre-verified interface cores. This ensures compliance and compatibility according to a given interface standard. In one embodiment, the target interface signaling speed grade is enabled by the selection of an appropriate FPGA speed grade. The programmable nature of the chip is utilized to optimize flexibility, cost, parallelism, and upgradeability for storage testing applications from SSDs, HDDs and other protocol based storage devices.

In one embodiment, the interface core may be acquired from a third party vendor but may require some customization to be compatible with the embodiments described herein. In one embodiment, the interface core/HBA provides two functions: 1) wraps storage commands into a standard protocol for transmission over a physical channel; and 2) is the electrical signal generator and receiver.

In one embodiment, each DUT has a dedicated power supply which may include current sense capability, and is controlled by the tester through a communication bus. In one embodiment, the handler may include a gripper 218, which moves the DUTs from the factory conveyor system to the tester and initiates the physical connection and release from the tester resources. A bay 220 that holds a DUT 215 provides environmental control to stress the DUT during testing. In one embodiment, the environmental control may be implemented in five varieties: per DUT thermal; shared thermal chamber for multiple DUTs; electro-magnetic noise to simulate the other components in a PC; humidity; and no thermal control for pure electrical functional testing. A PC-based system controller 225, which centrally coordinates individual tester electronics, power supplies, handlers and environmental controls, is coupled to each FPGA, power supply, and handler. A handler 219 may transfer DUTs from a belt/loader 230 to a bay 220.

In one embodiment, the pattern generators and matching IP interface cores are implemented on chip next to each other and are connected using dedicated bus links. The close proximity of system components allows optimization of the links to match the target interface speeds, avoids bottlenecks inherent in shared-bus architectures, and keeps bus translation overhead to an absolute minimum.

In one embodiment, the combination of dedicated on chip resources which may include storage pattern acceleration, close proximity of the system logic to each other and dedicated bus links ensures full speed testing for any target interface standard. Using a programmable IC allows full control to optimize between performance and cost. For example, in cases where the CPU of the programmable chip solution is fast enough to support more than one interface at full speed, costs can be reduced by removing the dedicated pattern generator resources. In one embodiment, a lower speed and lower cost programmable chip can be selected to reduce cost, if the target interfaces do not require 3 Gbps or higher speeds. In one embodiment, if the target interface uses less high speed channels to communicate with the DUT, the programmable chip can be reconfigured to generate additional tester-per-DUT instantiations.

While in some examples described herein, the FPGA-based tester may test DUTs that are SDDs, in other embodiments the FPGA-based tester may also test a variety of different types of DUTs including protocol-based modules. For example, a DUT may be a storage module, a solid state drive, a radio frequency (RF) module, wireless networking (WiFi) module, a module with optical connectivity, a hard drive, non-volatile memory device or module, a NAND flash storage device or a module, a storage class memory storage device or module, a volatile memory device or module, a module or device that requires protocol based communication as test patterns, a module or device that requires protocol based communication for setup within an ATE test system, etc.

In one embodiment, for storage/SSDs/HDDs, an FPGA-based tester may include a configurable IC that connects to a SSD and that is programmable to provide storage based patterns through a storage specific interface such as SATA or SAS.

In one embodiment, for RF modules, an FPGA-based tester may include a configurable IC where the configurable interface core is programmed to provide USB or PCIe interface connection, which use current RF modules.

In one embodiment, an FPGA-based tester may be an SSD or RF module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc. In one embodiment, in the case of an RF module-based tester, the interface core may be programmed to provide standardized protocol-based communications interfaces such as provide USB, PCIe, etc. In one embodiment, in a case of modules with optical interconnects, the interface core may be programmed to provide standardized protocol-based communication that is used to communicate with the module over an optical interconnect.

FIGS. 3A-D show several configurations that have different parallelisms and different instantiations of the test pattern generator. Each configuration can be uploaded to a programmable chip thus optimizing the tester for a given application based on the application parallelism, performance and cost needs. When the application needs change, a new configuration can be uploaded while utilizing the same tester.

Figure 3A:
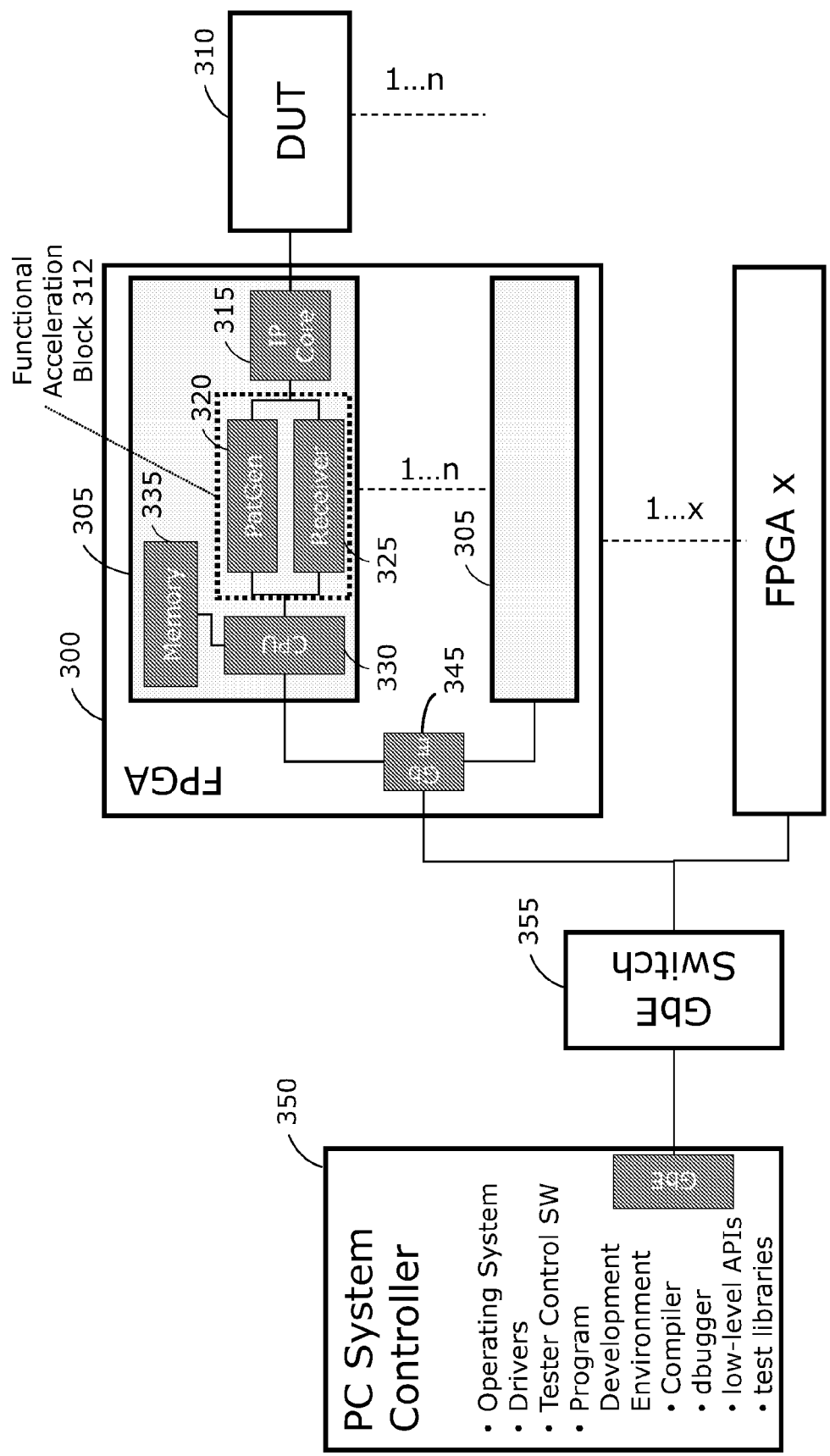
FIGS. 3A-3D illustrate block diagrams of 4 example configurations of an FPGA-based tester system, according to several embodiments.

FIG. 3A illustrates a block diagram of an example system that utilizes an FPGA 300, according to one embodiment. FPGA 300 includes one or more dedicated testers 305, each of which connects to a single DUT 310. In one embodiment, DUT 310 may be a storage device. In one embodiment, DUT 310 may be an SSD. Each dedicated tester 305 comprises an IP core 315, which connects directly to a DUT 310. As FIG. 3A shows, each dedicated tester 305 has its own on-chip test pattern generator which consists of a CPU 330, memory 335 and functional acceleration block 312. Accordingly, this configuration has no shared resources.

In one embodiment, FPGA 300 also includes one or more functional acceleration blocks 312 and an interface core 315. In one embodiment, each function acceleration block includes a dedicated pattern generator 320 and a receiver 325. In one embodiment, a test stimulus (e.g., test pattern) is provided by logic provided by a pattern generator 320 and receiver 325, which is controlled by on-chip CPU 330 with an associated memory 335.

In one embodiment, multiple testers 305 on a single FPGA 300 may be linked via an Ethernet connector 345. Multiple FPGAs 300 may be connected to system controller 350 via Ethernet (GbE) interface or through a switch 355. In one embodiment, system controller 350 may be implemented by a processor and may comprise an operating system (OS), drivers, tester control software, a program development environment including compiler, debugger, low-level APIs, and test libraries.

Figure 3B:
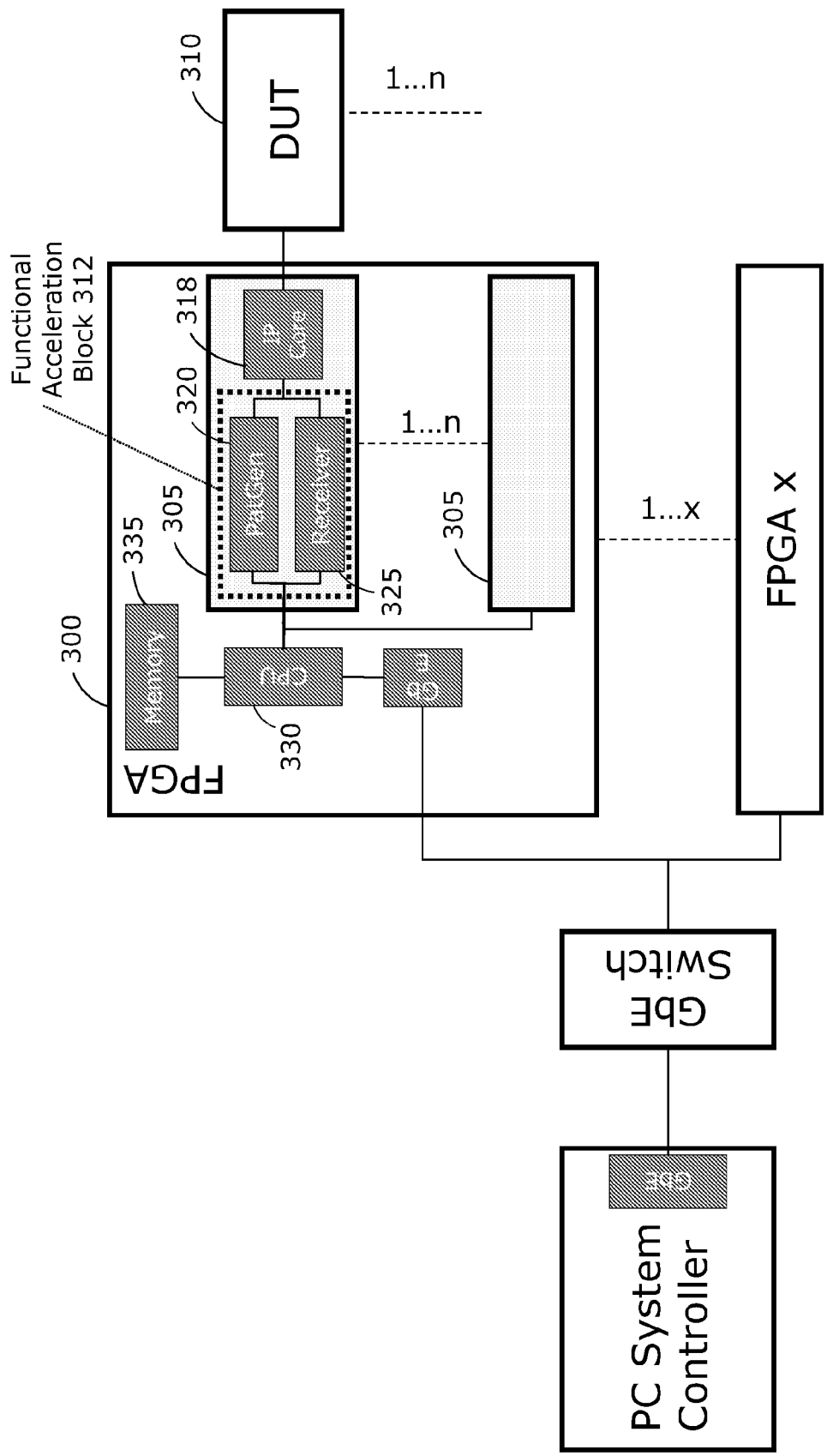
Figure 3C:
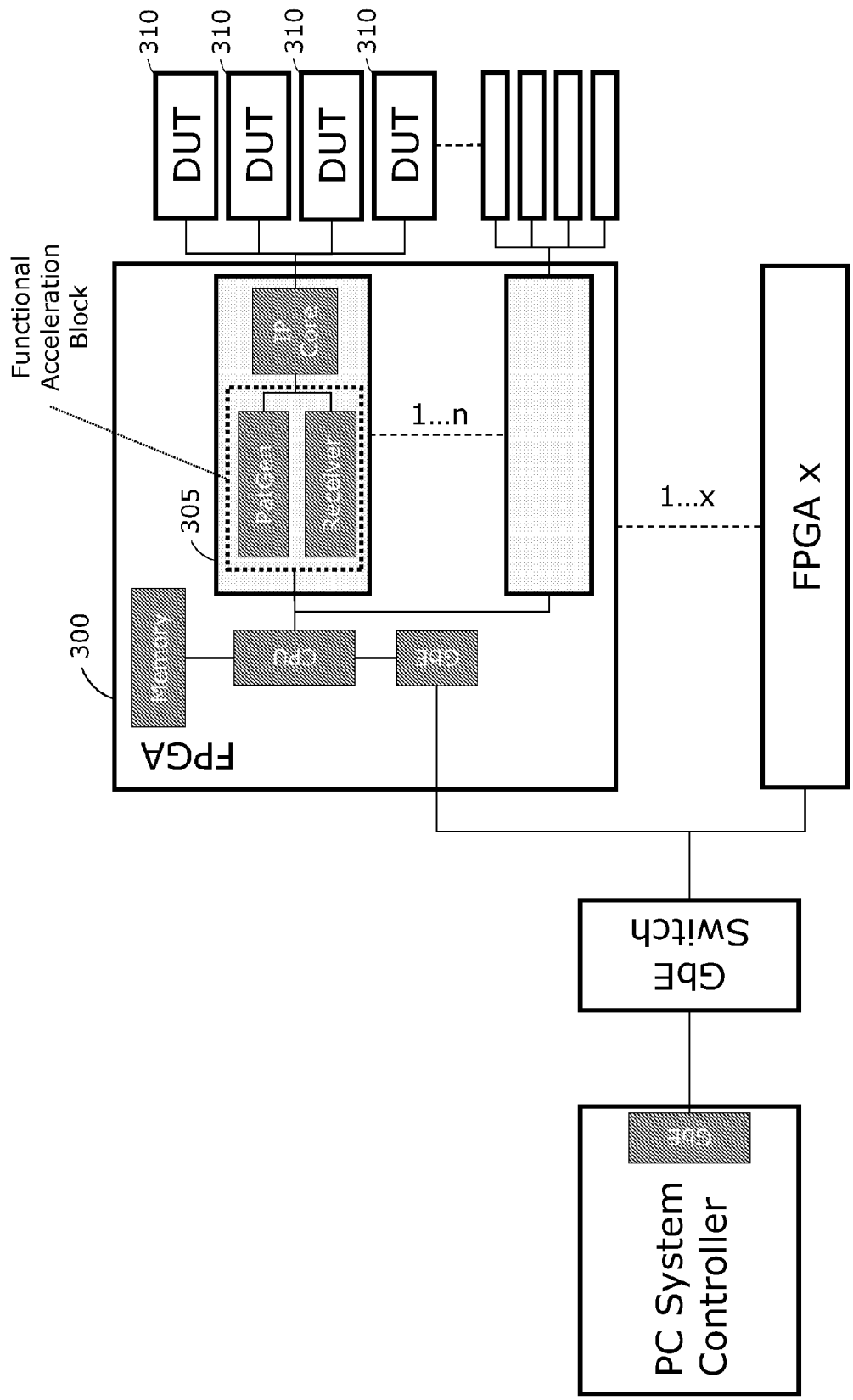
Figure 3D:
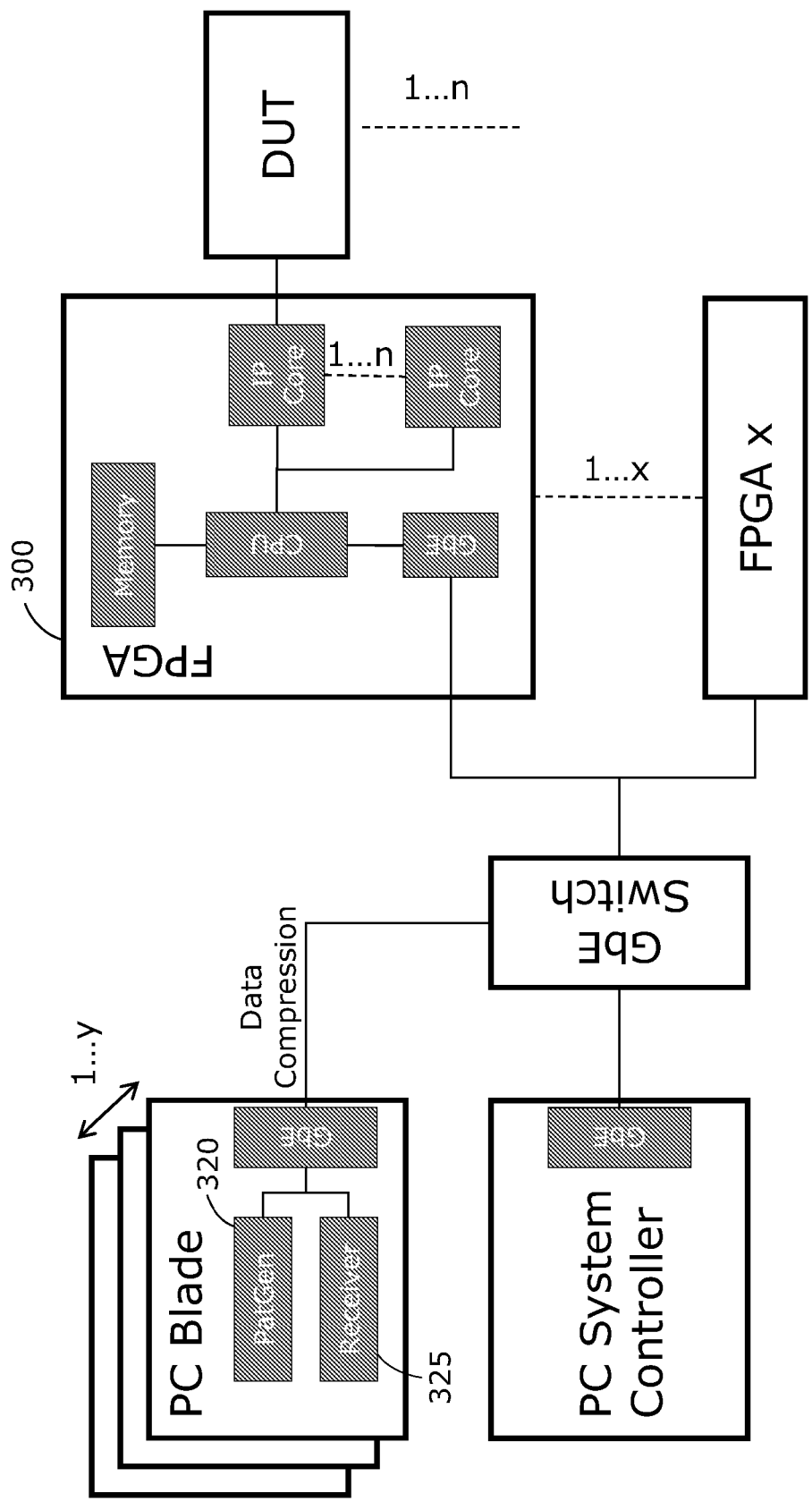

FIGS. 3B, 3C, and 3D show three other example FPGA configurations, according to other embodiments. Note that these embodiments are example configuration options, but not a complete or limiting set of configuration options.

FIG. 3B illustrates a block diagram of an example system that utilizes an FPGA 300, according to one embodiment. FPGA 300 includes one or more dedicated testers 305, each of which connects to a single DUT 310. In one embodiment, the dedicated portions of each tester 305 include a functional acceleration block 312 and an interface protocol core 318. In one embodiment, each functional acceleration block 312 includes a pattern generator 320 and a receiver 325.

The system of FIG. 3B is similar to that of FIG. 3A, except that the CPU 330 and associated memory 335 of FIG. 3B are shared between multiple testers 305. This configuration, which is desirable from a cost standpoint, is practical when the CPU processing power is capable of generating and receiving stimulus to support the number of DUTs connected to it at full speed. This configuration differs from shared-resource PC architecture in that this configuration is implemented on chip with its layout and dedicated bus optimizations, thus enabling the use of a slower on-chip processor.

FIG. 3C illustrates a block diagram of an example system that utilizes an FPGA 300, according to another embodiment. The system of FIG. 3C is similar to that of FIG. 3B, except that each dedicated tester 305 is connected to multiple DUTs 310. This may be referred to as a fan out configuration.

FIG. 3D illustrates a block diagram of an example system that utilizes an FPGA 300, according to another embodiment. In one embodiment, a pattern generator 320 and receiver 325 are located in a PC blade.

A key advantage of the embodiments described herein is their flexibility to optimize performance or cost by integrating the pattern generator and the interface logic on a single programmable chip, and having them in close proximity to minimize bottlenecks. In one embodiment, the system may be configured with a dedicated CPU per interface logic, or a single CPU can be shared across multiple interfaces if the CPU speed is sufficiently high compared to the required resources of the interfaces and the DUT.

As described in more detail below, some of the benefits of an FPGA-based tester system include smaller tester sizes, increased interface flexibility, greatly simplified product mix support, lower cost, and improved correlation and compatibility.

Size:

FIGS. 4A and 4B illustrate size differences between an FPGA-based tester system and a PC-based tester system.

FIG. 4A illustrates an FPGA-based tester system and a PC-based tester system 400, according to one embodiment. FPGA-based tester system 400 includes a programmable IC 405 and programmable pins 410. In particular embodiments, programmable IC 405 may include multiple testers (e.g., 4 to 8, or more). Each tester may have a CPU, memory, accelerator, and IP core. Programmable IC 405 may be an FPGA and have a size of 35 mm by 35 mm. Other sizes are possible. Programmable pins 410 connected to programmable IC 405 may be reconfigure to support a variety of DUTs (e.g., 8×SATA, 16×USB, 1/4/8×PCIe with 8/2/1 lanes, 2-8×SAS with 4-1 lanes, 8× fibre channel, etc.). Such a configurable IC chip is substantially smaller than a PC-based tester in a tower case, which could be 420×175×360 mm in size.

Each instantiation of a DUT tester supports the flexible, full-speed testing features of the embodiments described herein. In one embodiment, DUT testers may be implemented on a single programmable chip. With 4 to 8 DUT testers per programmable chip, the system as described herein can reach the same or lower cost than PC-based testers with the added advantage of flexibility and deterministic full speed parallel testing, which is not guaranteed with similarly priced shared-resource PC testers. With a larger programmable chip with more logic capability, higher parallelisms are possible.

FIG. 4B illustrates a PC-based tester system, which includes a motherboard 450 that connects to various types of HBA boards 460 in order to accommodate various types of DUTs. Such DUTs may include 3 Gbps SATA HBA, 6 Gbps SATA HBA, 3 Gbps SAS HBA, 6 Gbps SAS HBA, 4 g fiber channel HBA, etc. Other HBAs may include multi-link SAS, 12 Gbps SAS, 8 G fiber channel, etc.

As shown, a combination of a motherboard 450 and any additionally required HBA board 460 of FIG. 4B is much larger than the FPGA-based tester system 400 of FIG. 4A, which can accommodate the various types of DUTs with a single, programmable IC 405. With the PC-based tester, the user is required to plug in all of the different HBAs into the PC motherboard in order to support the different standards that are configurable with a single FPGA solution. The FPGA-based tester solution supports these 8 testers, or more.

Interface Flexibility:

Embodiments described herein achieve flexibility in testers in that the testers utilize an IP core that enables software-based changing of interfaces. Embodiments provide an ability to test multiple types of DUTs independent of HBA cards. With such interface flexibility, new interfaces may be loaded into the IP core of a programmable chip thereby eliminating the need for PC card host bus adapters.

In one embodiment, from an electrical perspective, FPGA-testers utilize an IP core instead of an HBA. Enabled by software programming of the programmable chip resources of an FPGA, a given IP core may be easily reprogrammed and replaced with another IP core without changing the physical FPGA chip or other hardware components. For example, if a given FPGA-based tester currently supports SATA, all that would be required to be able to connect to a fibre channel DUT is for the FPGA to be reprogrammed to use a fibre channel IP core instead of the existing IP core configured for SATA.

Another benefit of the interface flexibility of the FPGA-based tester embodiments is that when a new interface standard may be quickly implemented after being released by a standardization body. Such a new interface standard may then be implemented on the programmable chip of an FPGA-based tester long before a physical HBA board can be manufactured and sold as a solution in the PC market.

Embodiments described herein also provide the ability to generate early versions of an interface before HBAs are widely available and the ability to upgrade it when the standard finalizes. For example, in one embodiment, it is possible to implement early versions of a new standard and upgrade them as the standard is finalized. For example, in one embodiment, when a first cut of a standard (e.g., SAS 12G) is released, it is possible to generate an IP core version that either implements the protocol at a slower speed (e.g., slower than 12 Gbps), or implements a trimmed-down version of the protocol. Then, as the standard is finalized, software upgrades (e.g., that enable wide versus narrow port or add full 12 Gbps speed or add more than 2 times multilane capabilities, etc.) would be possible without changing the tester hardware.

Figure 5:
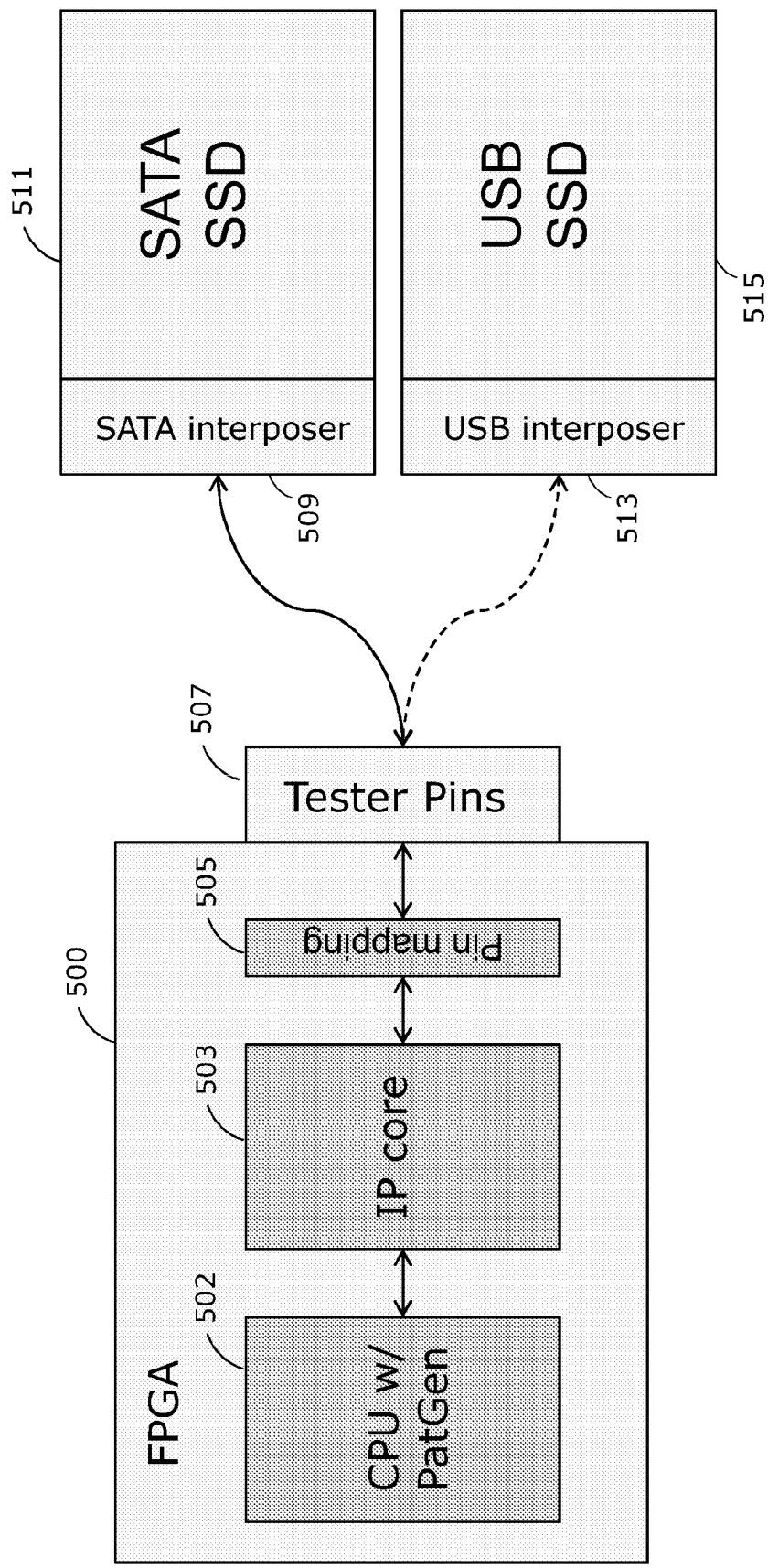
FIG. 5 illustrates a block diagram of an FPGA-based tester system utilizing interposers, which enable the FPGA to connect to different types of storage devices, according to one embodiment.

FIG. 5 illustrates a block diagram of a system utilizing interposers, which enable the FPGA to connect to different types of storage devices, according to one embodiment. The system tests different types of DUTs that require different numbers of pins and electrical resources. In one embodiment, an FPGA-based tester can change protocol support by replacing the IP core portion.

In one embodiment, the system includes an FPGA 500 having a firmware image, which includes a CPU 502 with a pattern generator, an IP core 503, and a pin map 505 for tester pins 507. In one embodiment, FPGA 500 may be loaded or programmed with different images, depending on the DUT. For example, if FPGA 500 is programmed with a SATA image, the SATA image would include a CPU, pattern generator, SATA IP core, and a SATA pin mapping. In one embodiment, an SATA interposer 509 enables FPGA 500 to connect to and test a SATA DUT (e.g., SATA SSD 511). Specifically, in one embodiment, FPGA 500 connects to SATA SSD 511 via tester pins 507 and SATA interposer 509.

If FPGA 500 is programmed with a USB image, the USB image would include a CPU, pattern generator, USB IP core, and a USB pin mapping. In one embodiment, a USB interposer 513 enables an FPGA 500 to connect to and test a USB DUT (e.g., USB SSD 515). Specifically, in one embodiment, FPGA 500 connects to USB SSD 515 via tester pins 507 and USB interposer 513.

Embodiments described herein also provide flexible usage of available high-speed pin resources to achieve different DUT parallelisms. For example, if different DUT interfaces use fewer pins than what is available on the programmable chip, multiple instances of the interface to the DUT may be implemented via programming. Thus, the number of testable devices may be optimized for each unique interface. A single hardware and software solution reduces tester complexity of supporting a mix of DUTs and eliminates the need for dedicated testers for each interface type.

FIGS. 6A-6E illustrate block diagrams of a system utilizing interposers and caddies, which enable an FPGA to connect to different types of storage devices, according to several embodiments.

Figure 6A:
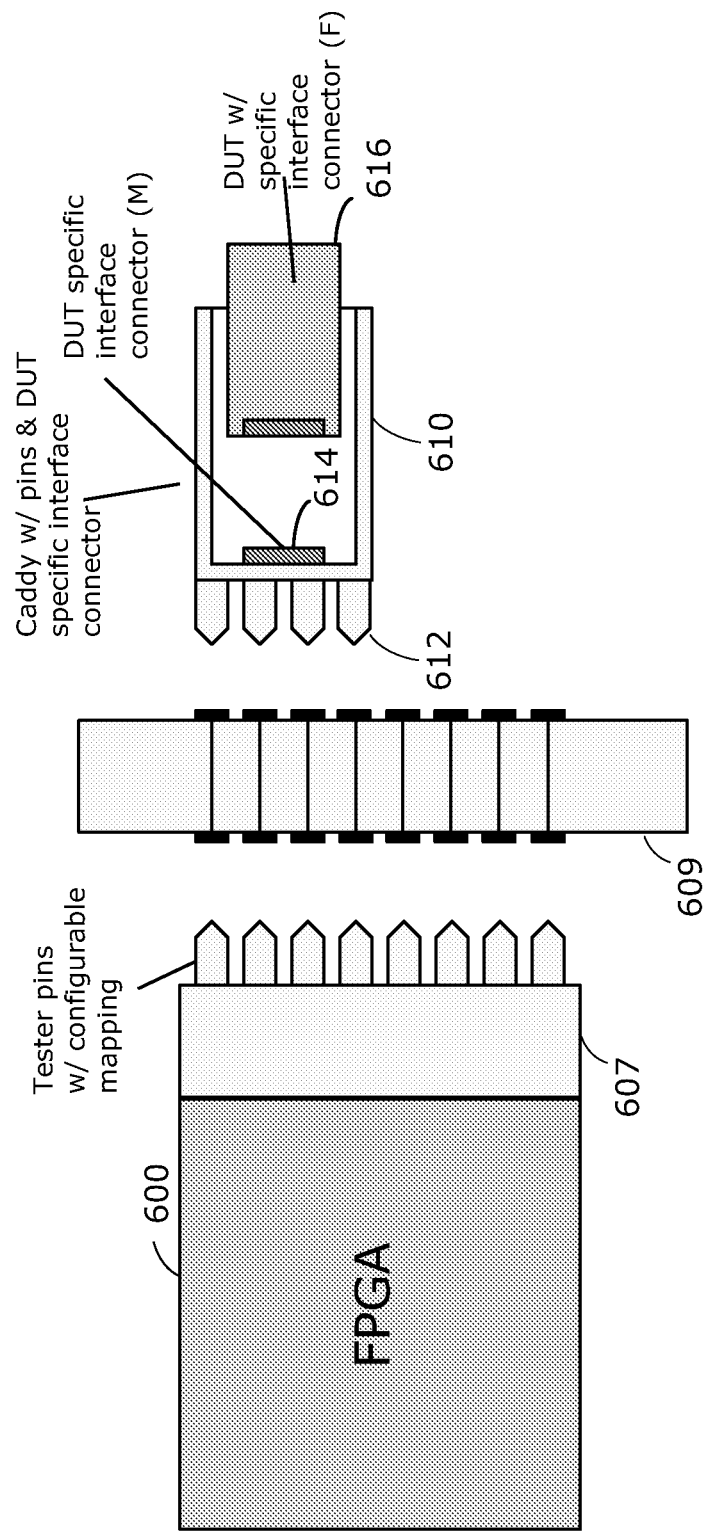
FIGS. 6A-6E illustrate block diagrams of an FPGA-based tester system utilizing interposers and caddies, which enable an FPGA to connect to different types of storage devices, according to several embodiments.

FIG. 6A illustrates a block diagram of a system utilizing an interposer and a single caddy. In one embodiment, the system tests different types of DUTs having different numbers of pins and requiring different electrical resources. In one embodiment, the system includes an FPGA 600 having tester pins 607 with configurable mapping, an interposer 609, and a caddy 610. Caddy 610 includes caddy pins 612 and a DUT-specific interface connector 614 that receives a DUT 616. In one embodiment, an interposer 609 and caddy 610 enable the FPGA-based tester to be reconfigured according to the appropriate electrical pins and interface protocol. As such, from a mechanical perspective, the system accommodates different DUTs having different, specific interface connectors with different numbers of pins.

In one embodiment, the interposer provides a defined consistent connection between the FPGA tester and the DUT. As indicated above, the FPGA tester includes tester pins that are configurable. In one embodiment, the interposer connects between the tester pins and caddy pins of one or more caddies. In one embodiment, the interposer includes female receptors that receive the tester pins and caddy pins. In one embodiment, the interposer has a rigid plane surface that provides reliable contact, electrical, and environmental/thermal isolation of the tester electronics from the DUT environment. In one embodiment, the environmental isolation aspect means that the temperature within the chamber may heat up without damaging the components outside of the chamber.

In one embodiment, the caddy connects between the interposer interface and the caddy interface. In one embodiment, the caddy includes a DUT-specific interface that connects to the DUT. In one embodiment, the caddy is disposable.

Figure 6C:
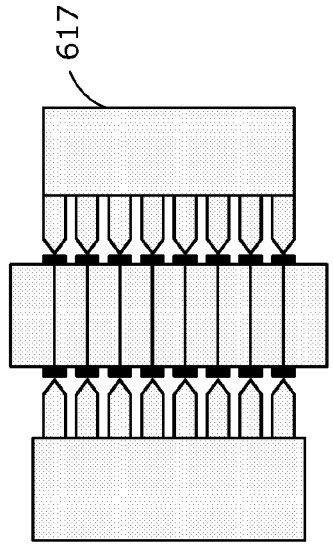
Figure 6E:
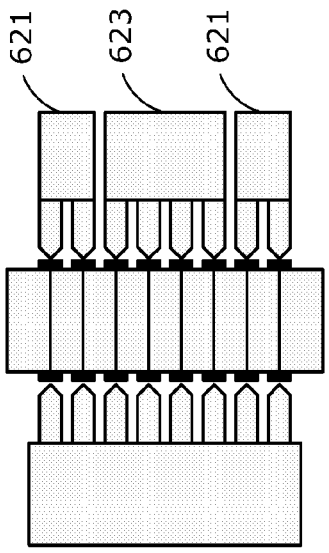
Figure 6B:
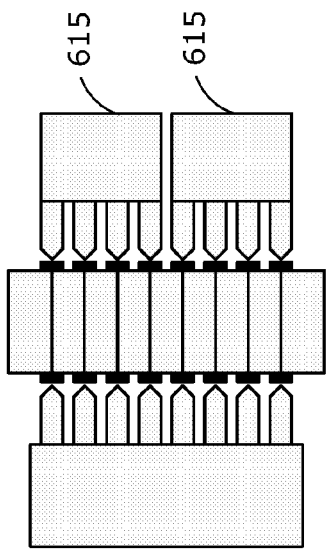
Figure 6D:
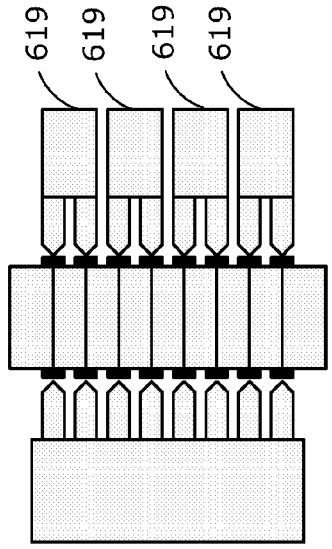

In one embodiment, there may be different, flexible configuration options. For example, FIG. 6B illustrates a block diagram of a system utilizing an interposer and two caddies 615, each of which may receive a medium pin-count storage device. FIG. 6C illustrates a block diagram of a system utilizing an interposer and one caddy 617, which may receive a high pin-count storage device. FIG. 6D illustrates a block diagram of a system utilizing an interposer and 4 caddies 619, each of which may receive a low pin-count storage device. FIG. 6E illustrates a block diagram of a system utilizing an interposer and three caddies, where each of caddies 621 may receive a low pin-count storage device and a caddy 623 may receive a medium pin-count storage device. FIGS. 6A-6E are example combinations, and other combinations are possible.

In one embodiment, caddies have a common shape in that they can accommodate different DUTs having different shapes and sizes. Providing a consistent shape allows the DUTs to be handled by a single robot gripper in automated handling. The area on the interposer which connects to the caddy may be optimized to connect to a fixed shape versus having to be adapted to each individual DUT form factor.

In one embodiment, the caddy functions as a sacrificial element to protect configurable tester pins when the at least one DUT uses connectors that fail faster than the connectors used by the configurable tester. This is particularly beneficial when the at least one DUT uses low-insertion count connectors. In some implementations, the DUTs being tested use connectors that are not meant to be used in a test environment where they get connected millions of times. A typical DUT connector for a PC consumer application such as SSDs may last approximately 1000 s of insertions. This means that after 1000 s insertions, the connector has a high risk of breaking. In the PC use case, a connector will never reach 1000 insertions. In a tester environment where multiple SSDs are tested in a day and each tested SSD represents one insertion and removal. One can quickly see that if the tester were to use the same connector as the DUT, the connector would fail very quickly. If the tester connector breaks, the user would need to replace the entire board that the connector is connected to, which is the whole tester electronics and is very expensive. Thus, the concept of use an interposer and caddy provides the benefits of a cheap sacrificial connector coupled with a beneficial space transformation.

The embodiments described herein provide several benefits. One benefit of positioning the connector in a disposable low-cost caddy is that the low-cost caddy breaks over time instead of the connector breaking over time. For example, a DUT-specific connector is not meant to support thousands of insertions needed by a high volume tester. The connector will break after hundreds of insertions. The caddy thus provides a cost-effective solution to breaking connectors.

Another benefit is that the caddy provides the space transformation between the DUT-specific interface pins and the tester pins. Another benefit is that if a particular interface protocol requires more or fewer pins than another interface protocol, the tester pins can be reprogrammed so that a higher pin count DUT can still be tested at the expense of parallelism. Lower pin count DUTs are typically tested at higher parallelism.

Correlation and Compatibility:

Embodiments described herein also provide correlation and compatibility. The use of proven IP cores from validated vendors ensures correlation and compatibility with existing interface standards when doing protocol-based testing. Tools such as protocol analyzers are available that may be used to verify if an IP core meets the standards requirements.

Embodiments described herein also provide full flexibility (e.g., to optimize performance and cost by uploading different versions of a tester, etc.). From dedicated resources per interface, sharing across multiple interfaces to Linux based PCs in a programmable chip.

In one embodiment, the SOPC approach of the FPGA-based tester may include a CPU and memory that allow the running of a full Linux operating system on each CPU used with the FPGA. This provides an additional layer of compatibility and correlation for test applications. In one embodiment, Linux based PC software, benchmarks, and drivers may be ported to the FPGA-based tester and run on it to provide an end-use environment that is similar to the environment of a PC. For example, a benchmark IOmeter may be ported to the FPGA and run as a daemon on the FPGA tester allowing attached DUTs to receive the same benchmarking stress as if from a PC based tester running IOmeter.

In one embodiment, an FPGA-based tester using a SOPC has an advantage of functioning as a PC-based tester. For instance, PC-based testers may be configured to use the same hardware, operating system, drivers, and application software as what would be used by a DUT in an actual user environment. For example, an SSD is a storage device that connects to an HBA located on a motherboard with a CPU and memory (which are the basic hardware components of a desktop PC system). In order to use the SSD for storage application on a desktop PC, an operating system such as Linux may be installed, which would include drivers for HBAs and storage devices.

On top of the operating system, the end user may develop application programs such as a file system explorer or a benchmark in order to test the performance of the SSD. The use of such application programs or benchmark is a good approach for testing DUTs, because it requires the complete system to work, not just an individual components. This is also a cost effective approach, because many existing software components and tools that are required for the DUT to work in the end-user environment can be reused.

A configurable FPGA-based tester is a custom test system, and, as such, typically requires custom software code to control the custom hardware. Through the selection of appropriate CPU architectures (e.g., PowerPC, x86 or ARM) for use with or embedded within the configurable IC and an open source operating system such as Linux, the complexity of creating a desktop PC system-like environment is greatly reduced to developing software drivers and the system-on-a-chip architecture used on the programmable IC.

Figure 7:
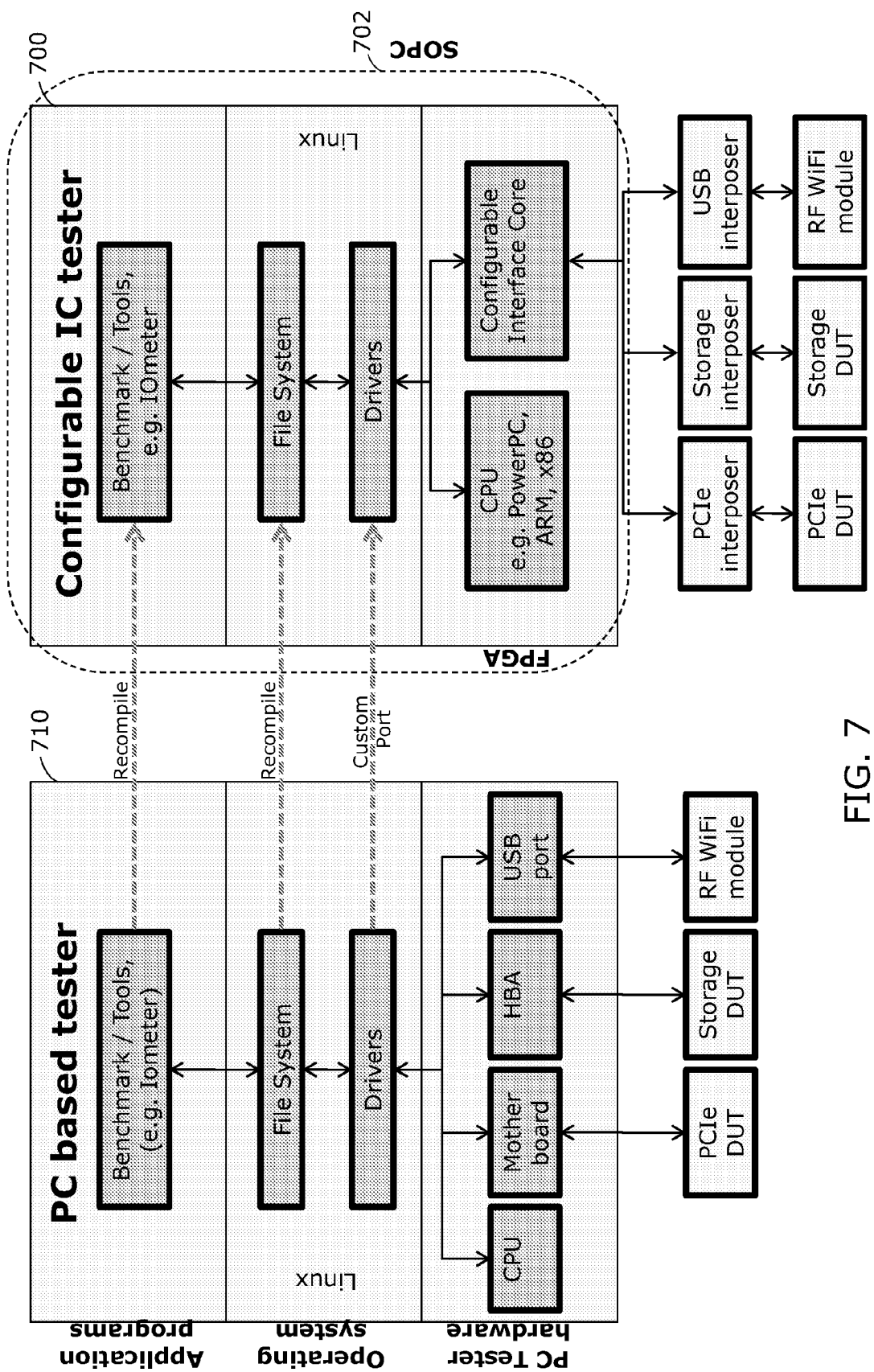
FIG. 7 illustrates a block diagram of an FPGA-based tester system using a system-on-a-programmable chip, according to one embodiment.

FIG. 7 illustrates a block diagram of an FPGA-based tester system 700 using a system-on-a-programmable chip (SOPC) 702, according to one embodiment. In one embodiment, FPGA-based tester system 700 may operate with a PC-based tester 710. The use of a SOPC design in an FPGA-based tester for ATE applications allows for desktop PC-like correlation by leveraging existing driver, operating system, application tools, and benchmarks. Other benefits of a SOPC design in an FPGA-based tester include improved performance, lower cost, and footprint optimized in a single programmable IC solution.

Greatly Simplified Product Mix Support:

Embodiments described herein provide greater simplification of product mix support. Conventionally, manufacturers buy dedicated testers to support a specific interface standard. Manufacturers buy multiples of one tester if they build more devices that require the same standard. Manufacturers buy different testers with different interface standards to support other, different products in their mix. For example, if a manufacturer builds 1,000 SATA drives and 100 fibre channel drives a week, the manufacturer will buy 10×100 SATA drive testers and 1 fibre channel drive tester. Manufacturers buy so many testers because it is very time consuming and incurs cost to change a SATA tester into a fibre channel tester. If the demand for fibre channel drops, the fiber channel tester will sit idle. If the demand goes up, the manufacturer will need to buy more testers.

With software-based reprogramming of a FPGA-based tester, embodiments described herein provide a major, positive impact on automatic test equipment (ATE). For example, assuming a PC-based tester with 100 SATA HBAs, it would take several hours to disassemble the tester to provide access to the SATA HBAs, pull out the HBAs out, and replace them with a fibre channel HBAs, and then reassemble the tester. With a FPGA-based tester, the reconfiguration is done in software, and can be completed in minutes.

With an FPGA-based software reconfigurable tester, it would be possible to increase the utilization of existing testers to address changes in product mix. For example a manufacturer has 10 SATA testers and 1 fibre channel tester that are FPGA based. If demand for fibre channel drives goes up and demand for SATA testers goes down, the manufacturer would not need to buy new testers. They would reconfigure some of their SATA testers to fibre channel testers. This can be done very quickly and with minimum effort thus reducing both reconfiguration costs and downtime as well as capital equipment cost savings since they did not need to buy new testers.

Upgradeability:

Embodiments described herein also provide the ability to upgrade or update the tester functionality in the field after shipment without needing to modify or handle the hardware. Such updates may include, for example, pay-per-use updates of new interface standards or versions.

FIGS. 8A and 8B illustrate various types of DUTs that an FPGA-based tester may test. FIG. 8A illustrates a table showing product categories (e.g., disk and PC card) and corresponding form factors, protocols, performance grades, number of device pins/lanes, and number of DUTs. FIG. 8B illustrates various types of HBAs that a single FPGA-based tester may replace. Such HBAs may include, for example, (e.g., parallel advanced technology attachment (PATA)/zero insertion force (ZIF), serial ATA (SATA), SAS, peripheral component interconnect express (PCIe), and fibre channel (FC), etc. In other words, different parallelisms are possible with a single FPGA-based tester. This is achieved by loading different firmware images for programming the FPGA. Each protocol standard may have a different protocol, number of pins, speed performance, connectors, etc.

Cost:

Embodiments described herein achieve higher cost savings by implementing multiple testers in a single chip, because a programmable chip achieves functionality at the same or lower costs than a PC. When purchased in volume, the more expensive FPGAs drop in price making the tester even more competitive. Indirect cost benefits include a faster time to swap interfaces and higher parallelism per square foot, which allows higher utilization and throughput where factory floor space is limited or where floor space is at a premium. The benefit of providing more testers is a smaller footprint, which is important to manufacturers where factory floor space is limited or where floor space is at a premium.

In one embodiment, an on-chip implemented functional accelerator block ensures dedicated per DUT resources which are optimized to match the speed of the target interface. Such a functional accelerator block allows deterministic stimulus of the DUT independent of the other implemented on chip testers.

In one embodiment, the functional accelerator block may function to offload work from the main processor. In one embodiment, the offloading may be achieved by the accelerator generating and receiving patterns. In one embodiment, the offloading may also be achieved by the accelerator combining multiple steps in a multi-step test function into a single step. For example, in one embodiment, the accelerator may provide a compare function that writes a pattern, reads that written pattern back, and then compares the two patterns. In one embodiment, the functional acceleration block may function to write a compare function. In one embodiment, the functional acceleration block functions as a logical comparison unit. This allows comparison of written data and the same data read back for a given storage address.

The hardware implementation allows very fast comparisons (microseconds vs. milliseconds) when compared to software based compare algorithms that require the execution of those software algorithms in a processor. With software based compare algorithms, write data needs to be stored in memory and sent over multiple busses to the DUT and then read back over multiple buses to be compared. This results in much overhead because of transmitting the data over multiple buses, and requires a fast processor to execute the comparison code.

In one embodiment, the functional acceleration block functions as a coprocessor in that it is used as a processor which supplements the functions of the primary processor (e.g., the CPU). In one embodiment, operations performed by the functional acceleration block may be floating point arithmetic, graphics, signal processing, string processing, or encryption. By offloading processor intensive tasks from the main processor to the functional acceleration block, the functional acceleration block accelerates the overall system performance. In one embodiment, the functional acceleration block may be used for both single DUT and parallel DUT testing.

Figure 9:
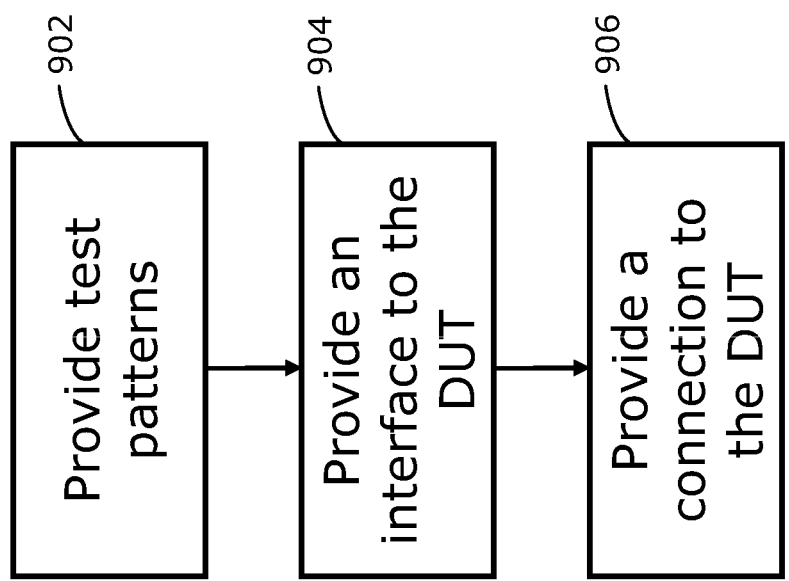
FIG. 9 is a flow diagram for an example method for testing a storage device, according to one embodiment.

FIG. 9 is a flow diagram for an example method for testing a data storage device, according to one embodiment. In one embodiment, the data storage device is an SSD. The method is initiated in block 902, where the configurable IC provides test patterns. In one embodiment, the test patterns are used to test a DUT. In one embodiment, the test patterns are provided using a configurable IC, where the test patterns are used in automated test equipment to test a DUT. In one embodiment, an interface to the DUT is provided in block 904. In one embodiment, the interface is provided using an configurable interface core that is programmable to provide functionality of one or more protocol based interfaces for the DUT and is programmable to interface with the at least one DUT. In one embodiment, a connection to the DUT is provided in block 906. In one embodiment, the connection is provided using a connection that is configurable to couple the configurable IC to the DUT.

In one embodiment, each of the processors (e.g., CPU 430 of FIG. 4) of the configurable IC generates test patterns. In one embodiment, each of the functional acceleration blocks (e.g., functional acceleration block 412 of FIG. 4) of the configurable IC generates test patterns. In one embodiment, where the one or more processors generate test patterns, one or more functional acceleration blocks may assist the one or more processors in generating the test patterns. For example, in one embodiment, a given functional acceleration block within the same configurable IC may assist the processor in the same configurable IC in generating test patterns.

In one embodiment, to provide test patterns, the configurable IC may execute a program running on a processor or a functional acceleration block between the processor and the interface. In one embodiment, the test patterns are protocol-based test patterns. In one embodiment, a given storage interface protocol may be SATA, SAS, Fibre Channel, PCIe, USB, Compact Flash, SD, ONFI and the connected DUTs are SATA, SAS, Fibre Channel, PCIe, USB, Compact Flash, SD, ONFI storage devices. In one embodiment, protocol based communications may be parallel or serial protocols such as Ethernet, SATA, PATA, WiFi and connected DUTs are devices that require Ethernet, SATA, PATA, WiFi connections to communicate with them.

The hardware implemented functional acceleration block may be used to accelerate a wide variety of software test functions. Such software test functions may include, for example: executing pre-defined patterns from a programmable buffer, algorithmic patterns like counters, checker board patterns, randomly generated data, comparison units that compare written data with read back data in a single step, protocol analyzer and injector by allowing access to the protocol level communication, etc. In block 804, the configurable IC provides an interface to the DUT. In a block 806, a connection is provided to the at least one DUT, where the connection is coupled directly between the configurable IC and the at least one DUT.

The embodiments described herein or portions thereof may be computer-implemented. The computer system may include a processor (e.g., a processor core, a microprocessor, a computing device, etc.), a main memory and a static memory, which communicate with each other via a bus. The machine may further include a display unit that may comprise a touch-screen, or a liquid crystal display (LCD), or a light emitting diode (LED) display, or a cathode ray tube (CRT). As shown, the computer system also may include a human input/output (I/O) device (e.g. a keyboard, an alphanumeric keypad, etc), a pointing device (e.g., a mouse, a touch screen, etc.), a drive unit (e.g., a disk drive unit, a CD/DVD drive, a tangible computer readable removable media drive, an SSD storage device, etc.), a signal generation device (e.g., a speaker, an audio output, etc), and a network interface device (e.g., an Ethernet interface, a wired network interface, a wireless network interface, a propagated signal interface, etc.).

The drive unit may include a machine-readable medium on which is stored a set of instructions (e.g., software, firmware, middleware, etc.) embodying any one, or all, of the methodologies described above. The set of instructions is also shown to reside, completely or at least partially, within the main memory and/or within the processor. The set of instructions may further be transmitted or received via the network interface device over the network bus.

It is to be understood that embodiments of this invention may be used as, or to support, a set of instructions executed upon some form of processing core (such as the CPU of a computer) or otherwise implemented or realized upon or within a machine- or computer-readable medium. A machine-readable medium includes any mechanism for storing or transmitting information in a form readable by a machine (e.g. a computer). For example, a machine-readable medium includes read-only memory (ROM); random access memory (RAM); magnetic disk storage media; optical storage media; flash memory devices; electrical, optical, acoustical or other form of propagated signals (e.g. carrier waves, infrared signals, digital signals, etc.); or any other type of media suitable for storing or transmitting information.

It is not expected that the invention be limited to the exact embodiments disclosed herein. Those skilled in the art will recognize that changes and modifications can be made without departing from the inventive concept. By way of example, configurable integrated circuits other than FPGAs may be used. A non-configurable integrated circuit which implements the flexibility and size benefits of the invention at the cost parity or lower than a configurable IC may be used. The scope of the invention may be construed in view of the claims.

The invention claimed is:

1. A system comprising:
    a configurable integrated circuit (IC) programmable to provide test patterns for use in automated test equipment, wherein the configurable IC includes:
        a configurable interface core, and wherein the configurable interface core is programmable to provide functionality of one or more protocol based interfaces for at least one device under test (DUT) and is programmable to interface with the at least one DUT;
    a connection configurable to couple the configurable IC to the at least one DUT;
    wherein the connection configurable to couple the IC to the at least one DUT comprises tester pins, further comprising a caddy coupled between the tester pins and the at least one DUT, wherein the caddy is a sacrificial connector connected to the at least one DUT; and
    an interposer coupled to the configurable IC, where the interposer is disposed between the caddy and the tester pins.

2. The system of claim 1 wherein the configurable interface core is programmed with a plurality of different protocols for testing a plurality DUTs having different protocol-based communication interfaces.

3. The system of claim 1 wherein two or more protocols are implemented at one time enabling multiple protocols to be tested and enabling a module that has multiple protocols to be tested at the same time.

4. The system of claim 1 wherein one protocol is implemented at a time, and wherein reprogramming the interface core enables different protocols to be tested and enables multiple DUTs in parallel to be optimized.

5. The system of claim 1 wherein the configurable interface core is user-upgradeable to allow reprogramming in the field.

6. The system of claim 1 wherein the configurable interface core is pre-verified for full compliance with at least one standardized protocol-based communication interface.

7. The system of claim 1 wherein the configurable IC is a system-on-a-programmable chip (SOPC) that enables correlation with PC-based test systems.

8. The system of claim 1
wherein the caddy is coupled to the interposer and to the at least one DUT, wherein the caddy provides a space transformation between configurable tester pins of the programmable IC and a DUT-specific interface.

9. The system of claim 1
wherein the caddy is coupled to the interposer and to the at least one DUT, wherein the caddy has a common shape that receives different DUTs for handling purposes.

* * * * *